US010622417B2

United States Patent
Chen

(10) Patent No.: US 10,622,417 B2
(45) Date of Patent: Apr. 14, 2020

(54) MANUFACTURING METHOD OF A FLEXIBLE OLED DISPLAY PANEL

(71) Applicant: Wuhan China Star Optoelectronics Semiconductor Display Technology Co., Ltd., Wuhan, Hubei (CN)

(72) Inventor: Xia Chen, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 175 days.

(21) Appl. No.: 15/578,698

(22) PCT Filed: Nov. 28, 2017

(86) PCT No.: PCT/CN2017/113222
§ 371 (c)(1),
(2) Date: Nov. 30, 2017

(87) PCT Pub. No.: WO2019/095430
PCT Pub. Date: May 23, 2019

(65) Prior Publication Data
US 2019/0198584 A1 Jun. 27, 2019

(30) Foreign Application Priority Data
Nov. 20, 2017 (CN) .......................... 2017 1 1160769

(51) Int. Cl.
*H01L 27/32* (2006.01)
*H01L 51/52* (2006.01)
(Continued)

(52) U.S. Cl.
CPC .......... *H01L 27/3244* (2013.01); *G09F 9/301* (2013.01); *H01L 27/323* (2013.01);
(Continued)

(58) Field of Classification Search
None
See application file for complete search history.

(56) References Cited

U.S. PATENT DOCUMENTS

2002/0167024 A1 11/2002 Jabbour et al.
2017/0301860 A1* 10/2017 Yamazaki ........... H01L 27/1266
(Continued)

FOREIGN PATENT DOCUMENTS

CN 101075659 11/2007
CN 101587939 A 11/2009
(Continued)

*Primary Examiner* — Angel Roman
(74) *Attorney, Agent, or Firm* — Hemisphere Law, PLLC

(57) ABSTRACT

The present disclosure discloses a manufacturing method of a flexible OLED display panel, including: providing a rigid substrate and forming a flexible substrate on the rigid substrate; forming a thin film transistor array layer on the flexible substrate; forming an OLED display unit on the thin film transistor array layer; forming an encapsulation layer on the OLED display unit; forming a protection cover on the encapsulation layer; and peeling the rigid substrate from the flexible substrate by using a laser lift-off process. The present disclosure is uses a coating process or a printing process to form each layer structure in a flexible OLED display panel. The manufacturing method effectively reduces the total thickness of the device and increases the adhesion between the layers so as to avoid the problem that the flexible OLED display panel is wrinkled or peeled when bent.

19 Claims, 4 Drawing Sheets

(51) Int. Cl.
*H01L 51/00* (2006.01)
*H01L 51/56* (2006.01)
*G09F 9/30* (2006.01)
*H01L 51/50* (2006.01)
*H01L 27/12* (2006.01)

(52) U.S. Cl.
CPC ........ *H01L 51/003* (2013.01); *H01L 51/5237* (2013.01); *H01L 51/5253* (2013.01); *H01L 51/56* (2013.01); *H01L 27/127* (2013.01); *H01L 27/1262* (2013.01); *H01L 51/0004* (2013.01); *H01L 51/0022* (2013.01); *H01L 51/0097* (2013.01); *H01L 51/5012* (2013.01); *H01L 51/5056* (2013.01); *H01L 51/5072* (2013.01); *H01L 51/5206* (2013.01); *H01L 51/5221* (2013.01); *H01L 2227/323* (2013.01); *H01L 2227/326* (2013.01); *H01L 2251/5338* (2013.01)

(56) References Cited

U.S. PATENT DOCUMENTS

| | | | |
|---|---|---|---|
| 2017/0338291 A1* | 11/2017 | Ishii | H01L 27/3244 |
| 2018/0190917 A1* | 7/2018 | Oh | B32B 7/06 |
| 2018/0197975 A1* | 7/2018 | Jinbo | H01L 51/0027 |
| 2018/0204884 A1* | 7/2018 | Isa | H01L 51/0097 |

FOREIGN PATENT DOCUMENTS

| | | |
|---|---|---|
| CN | 103119699 | 5/2013 |
| CN | 105428554 A | 3/2016 |
| CN | 105580120 | 5/2016 |
| CN | 105591036 | 5/2016 |
| CN | 106328683 A | 1/2017 |
| CN | 106654063 A | 5/2017 |
| CN | 107263892 | 10/2017 |
| JP | 2000243555 | 9/2000 |

* cited by examiner

MANUFACTURING METHOD OF A FLEXIBLE OLED DISPLAY PANEL

RELATED APPLICATIONS

The present application is a National Phase of International Application Number PCT/CN2017/113222, filed Nov. 28, 2017, and claims the priority of China Application No. 201711160769.X, filed Nov. 20, 2017.

FIELD OF THE DISCLOSURE

The present disclosure relates to a display technology field, and more particularly to a manufacturing method of a flexible OLED display panel.

BACKGROUND OF THE DISCLOSURE

Organic light-emitting diodes (OLED) display panel has advantages of self-luminous, high contrast, thin thickness, wide viewing angle and fast response, etc., is the representative of a new generation of flat panel display technology, more and more respected by the industry. The flexible OLED display panel is one of the important trends.

Flexible OLED display panels can not only be thinner and lighter in size, but also reduce power consumption, thereby helping to enhance the life of the corresponding product. Meanwhile, due to the bendability and flexibility of the flexible OLED display panel, the durability of the OLED display panel is also higher than the conventional hard display panel. Flexible OLED display panel can be widely used in a variety of products with display capabilities, such as can be used in tablets, TVs, mobile terminals and a variety of wearable devices.

Generally, a flexible OLED display panel includes a flexible substrate and a thin film transistor array layer, an OLED display unit, an encapsulation layer, and a protection cover formed on the flexible substrate. In some aspects, a functional structure layer such as a touch structure layer and a polarizer is further arranged between the encapsulation layer and the protection cover. In an existing manufacturing process of a flexible OLED display panel, the thin film transistor array layer is usually formed by using a deposition film combined with a photolithography process to form a patterned device structure. The process thereof is not only energy consuming but also costly. The functional structure layers on the encapsulation layer, such as the protection cover, the touch structure layer and the polarizer, are usually attached to the encapsulation layer sequentially by using OCA optical glue. The total thickness of the flexible OLED display panel obtained by the preparation is relatively large, which is unfavorable to the light and thin development of the display panel. And in the way of attaching by the OCA optical glue, the adhesion between the layers is relatively small, so that the problem of wrinkles or peeling easily occurs during bending.

SUMMARY OF THE DISCLOSURE

In view of this, the present disclosure provides a manufacturing method of a flexible OLED display panel, the manufacturing method can effectively reduce the total thickness of the device and increase the adhesion between the layers so as to avoid the problem that the flexible OLED display panel is wrinkled or peeled when bent.

In order to achieve the above object, the present disclosure adopts the following technical solutions:

a manufacturing method of a flexible OLED display panel, wherein the flexible OLED display panel includes a thin film transistor array layer, an OLED display unit, an encapsulation layer and a protection cover sequentially formed on a flexible substrate, and the manufacturing method includes:

providing a rigid substrate and forming a flexible substrate on the rigid substrate by using a coating process;

forming a thin film transistor array layer on the flexible substrate by using an electronic printing process;

forming an OLED display unit on the thin film transistor array layer by using an electronic printing process;

forming an encapsulation layer on the OLED display unit by using an electronic printing process;

forming a protection cover on the encapsulation layer by using a coating process; and peeling the rigid substrate from the flexible substrate by using a laser lift-off process.

Wherein the step of forming a thin film transistor array layer by using an electronic printing process specifically includes: patterning a gate on the flexible substrate by using an electronic printing process; printing a gate insulating layer on the flexible substrate by using an electronic printing process, wherein the gate insulating layer covers the gate; patterning a source and a drain on the gate insulating layer by using an electronic printing process; printing a patterned active layer between the source and the drain by using an electronic printing process, wherein both ends of the active layer are respectively connected with the source and the drain; and printing a flat layer on the gate insulating layer by using an electronic printing process, wherein the flat layer covers the source, the drain and the active layer.

Wherein the step of forming an OLED display unit by using an electronic printing process specifically includes: printing an anode layer on the thin film transistor by using an electronic printing process; printing an organic light emitting layer on the anode layer by using an electronic printing process; and printing a cathode layer on the organic light emitting layer by using an electronic printing process.

Wherein the organic light emitting layer includes a hole transport functional layer, a light emitting material layer and an electron transport functional layer sequentially formed on the anode layer.

A touch structure layer is further arranged between the encapsulation layer and the protection cover; wherein, forming the touch structure layer on the encapsulation layer by using an electronic printing process.

Wherein a nano-silver electronic ink is used as a printing material, and a touch electrode and an electrode lead of the touch structure layer are printed on the encapsulation layer by using an electronic printing process.

A polarizer is further arranged between the touch structure layer and the protection cover; wherein forming the polarizer on the touch structure layer by using a coating process.

Wherein the coating process is a slit coating process or a spin-coating process or a spraying process.

Wherein the electronic printing process is an ink-jet printing process or a screen printing process Wherein material of the flexible substrate is polyimide, polycarbonate, polyethersulfone, polyethylene terephthalate, polyethylene naphthalate, polyarylate or glass fiber reinforced plastic.

The manufacturing method of a flexible OLED display panel provided by the present disclosure is uses a coating process or a printing process to form each layer structure in a flexible OLED display panel. The manufacturing method effectively reduces the total thickness of the device and increases the adhesion between the layers so as to avoid the problem that the flexible OLED display panel is wrinkled or peeled when bent.

DETAILED DESCRIPTION OF PREFERRED EMBODIMENTS

Figure 1:
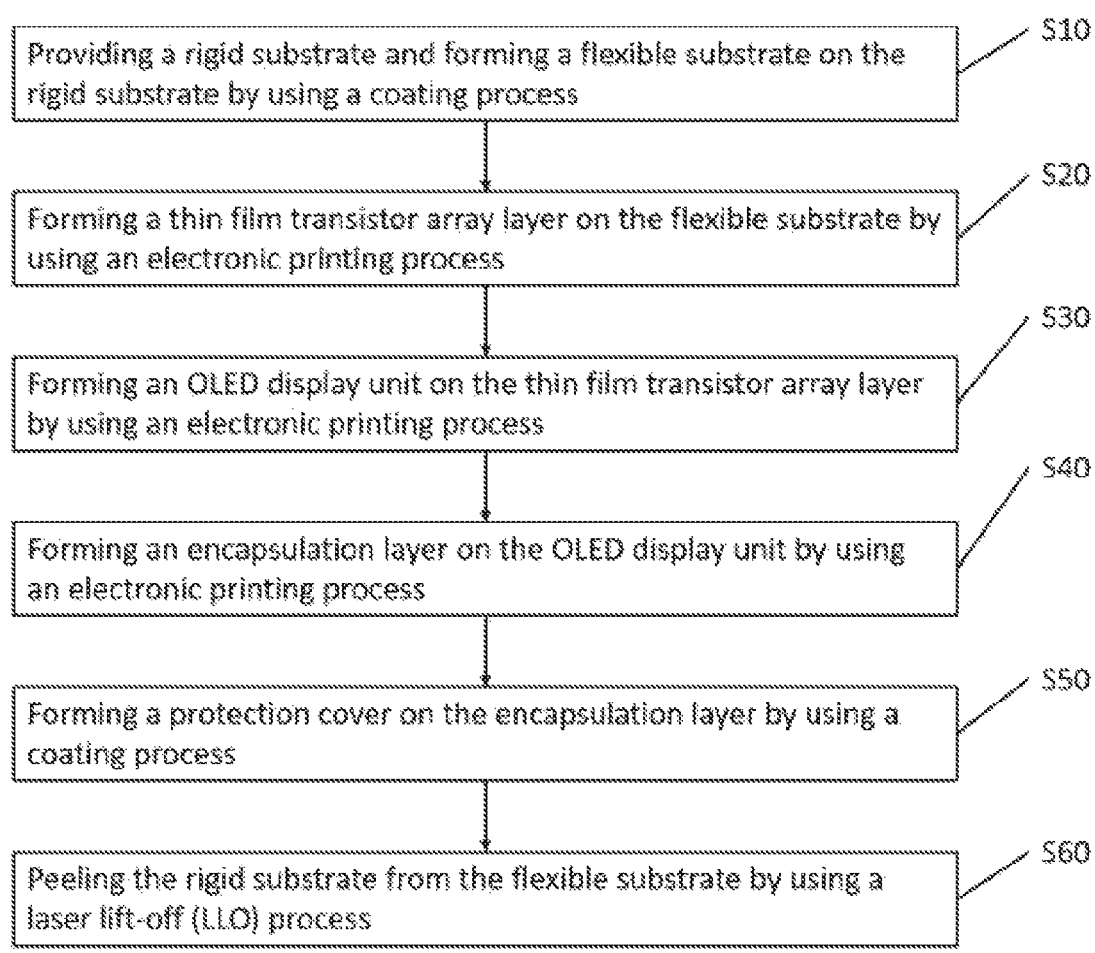
FIG. 1 is a flowchart of a manufacturing method of a flexible OLED display panel according to an embodiment of the present disclosure.

To make the objectives, technical solutions, and advantages of the present disclosure clearer, the following describes the specific implementation manners of the present disclosure in detail with reference to the accompanying drawings. Examples of these preferred embodiments are illustrated in the drawings. The embodiments of the present disclosure shown in the drawings and described in the drawings are merely exemplary and the present disclosure is not limited to these embodiments.

Here, it should also be noted that, in order to avoid obscuring the present disclosure with unnecessary detail, only the structures and/or processing steps that are closely related to the solution according to the present disclosure are shown in the drawings, and other details of the present disclosure less concerned are omitted.

The present embodiment provides a manufacturing method of a flexible OLED display panel, referring to FIG. 1, the manufacturing method includes the steps of:

S10, providing a rigid substrate and forming a flexible substrate on the rigid substrate by using a coating process. Wherein the rigid substrate is selected as a glass substrate. Material of the flexible substrate may be polyimide (PI), polycarbonate (PC), polyethersulfone (PES), polyethylene terephthalate (PET), polyethylene naphthalate (PEN), polyarylate (PAR) or glass fiber reinforced plastic (FRP) and other polymer materials. The coating process can be selected as a slit coating process or a spin-coating process or a spraying process. In this embodiment, a slit coating process is preferably used.

Figure 2:
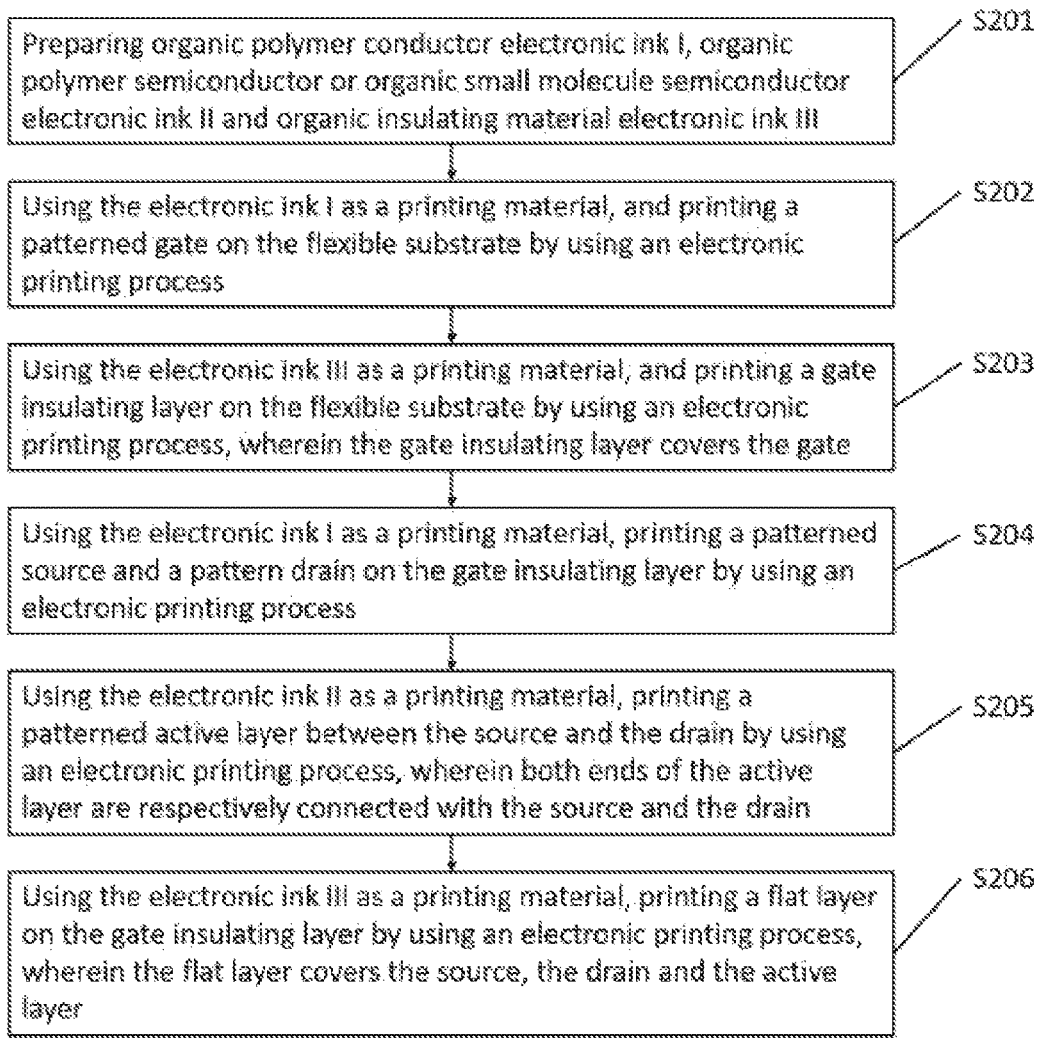
FIG. 2 is a flowchart of a process of forming a thin film transistor array layer according to an embodiment of the present disclosure.

S20, forming a thin film transistor array layer on the flexible substrate by using an electronic printing process. Referring to FIG. 2, the step specifically includes:

S201, preparing organic polymer conductor electronic ink I, organic polymer semiconductor or organic small molecule semiconductor electronic ink II and organic insulating material electronic ink III.

S202, using the electronic ink I as a printing material, and printing a patterned gate on the flexible substrate by using an electronic printing process.

S203, using the electronic ink III as a printing material, and printing a gate insulating layer on the flexible substrate by using an electronic printing process, wherein the gate insulating layer covers the gate.

S204, using the electronic ink I as a printing material, printing a patterned source and a pattern drain on the gate insulating layer by using an electronic printing process.

S205, using the electronic ink II as a printing material, printing a patterned active layer between the source and the drain by using an electronic printing process, wherein both ends of the active layer are respectively connected with the source and the drain.

S206, using the electronic ink III as a printing material, printing a flat layer on the gate insulating layer by using an electronic printing process, wherein the flat layer covers the source, the drain and the active layer.

In the step S20, the electronic printing process can be selected as an ink-jet printing process or a screen printing process, preferably using an ink-jet printing process. Compared with the prior art method of using the deposition thin film combined with the photolithography process, the method of forming a thin film transistor array layer by the electronic printing process can reduce the process difficulty and also reduce the thickness of the thin film transistor array layer, which further facilitates the light and thin development of the display panel.

Figure 3:
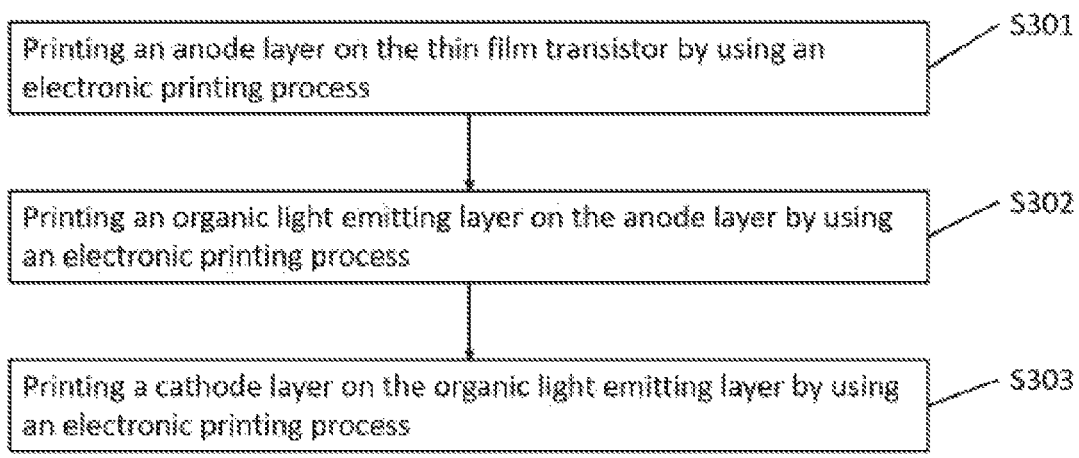
FIG. 3 is a flowchart of a process of forming an OLED display unit according to an embodiment of the present disclosure.

S30, forming an OLED display unit on the thin film transistor array layer by using an electronic printing process. Referring to FIG. 3, the step specifically includes:

S301, printing an anode layer on the thin film transistor by using an electronic printing process.

S302, printing an organic light emitting layer on the anode layer by using an electronic printing process.

S303, printing a cathode layer on the organic light emitting layer by using an electronic printing process.

In the step S30, the electronic printing process can be selected as an ink-jet printing process or a screen printing process, preferably using an ink-jet printing process.

S40, forming an encapsulation layer on the OLED display unit by using an electronic printing process. Wherein the electronic printing process can be selected as an ink-jet printing process or a screen printing process, preferably using an ink-jet printing process.

S50, forming a protection cover on the encapsulation layer by using a coating process. Wherein the coating process can be selected as a slit coating process or a spin-coating process or a spraying process. In this embodiment, a spin-coating process is preferably used. The use of a coating process to form a protection cover provides a greater degree of cohesion of the protection cover and reduces the thickness of the device as compared to using an OCA optical adhesive.

S60, peeling the rigid substrate from the flexible substrate by using a laser lift-off (LLO) process.

Figure 4:
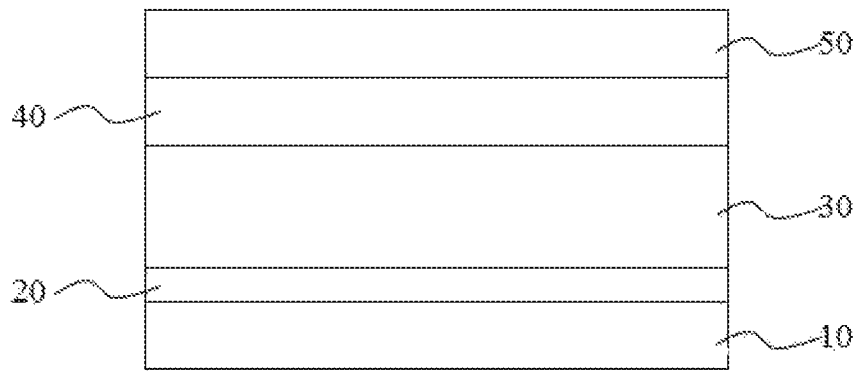
FIG. 4 is a schematic structural diagram of an OLED display panel formed according to an embodiment of the present disclosure.
Figure 5:
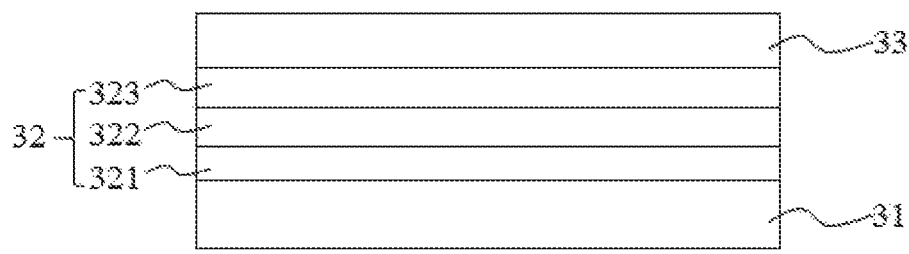
FIG. 5 is a schematic structural diagram of an OLED display unit according to an embodiment of the present disclosure.

In the above manufacturing method of a flexible OLED display panel, each layer structure in the flexible OLED display panel is formed by coating or printing process, the formed flexible OLED display panel is shown in FIG. 4. The flexible OLED display panel includes a thin film transistor array layer 20, an OLED display unit 30, an encapsulation layer 40 and a protection cover 50 sequentially formed on a flexible substrate 10. As shown in FIG. 5, the OLED display unit 30 includes an anode layer 31, an organic light emitting layer 32 and a cathode layer 33 sequentially formed on the thin film transistor array layer 20. The organic light emitting layer 32 includes a hole transport layer (HTL) 321, an emissive layer (EML) 322 and an electron transport layer (ETL) 323 prepared by organic materials.

Figure 6:
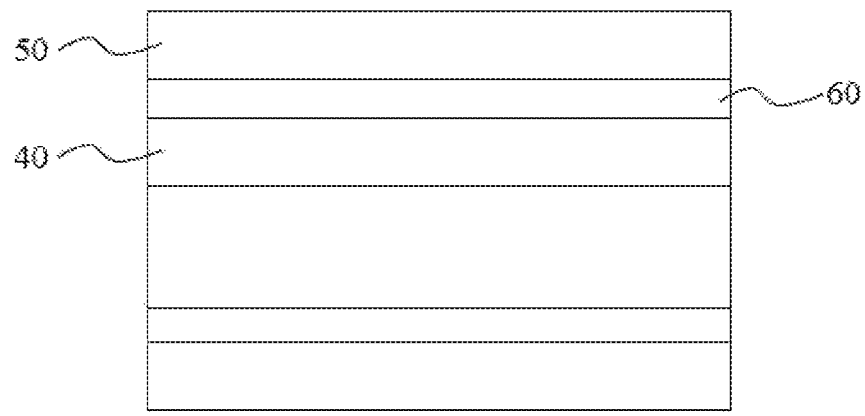
FIG. 6 is a schematic structural diagram of another OLED display panel formed according to an embodiment of the present disclosure.

In another preferred embodiment as shown in FIG. 6. In the flexible OLED display panel, a touch structure layer 60 is further arranged between the encapsulation layer 40 and the protection cover 50. Therefore, in the manufacturing method corresponding to the flexible OLED display panel provided in the foregoing embodiment, further includes steps between step S40 and step S50:

S40-1, forming a touch structure layer on the encapsulation layer by using an electronic printing process. Wherein a nano-silver electronic ink is used as a printing material, and a touch electrode and an electrode lead of the touch structure layer are printed on the encapsulation layer by using an electronic printing process. Wherein the electronic printing process may be selected as an ink-jet printing process or a screen printing process, preferably using a screen printing process. The use of an electronic printing process to form a touch structure layer provides a greater degree of cohesion of the touch structure layer and reduces the thickness of the device as compared to using an OCA optical adhesive.

Figure 7:
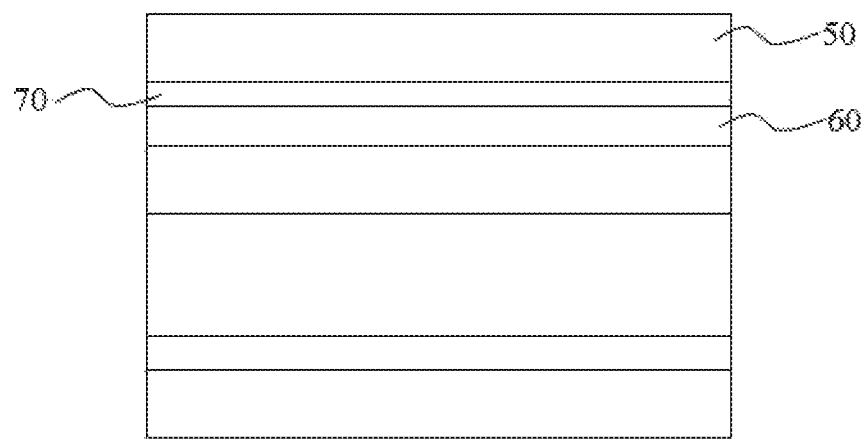
FIG. 7 is a schematic structural diagram of another OLED display panel formed according to an embodiment of the present disclosure.

Further, in another preferred embodiment as shown in FIG. 7. In the flexible OLED display panel, a polarizer 70 is further arranged between the touch structure layer 60 and the protection cover 50. Therefore, in the manufacturing method corresponding to the flexible OLED display panel provided in the foregoing embodiment, further includes steps between step S40-1 and step S50:

S40-2, forming a polarizer on the touch structure layer by using a coating process. Wherein the coating process can be selected as a slit coating process or a spin-coating process or a spraying process. In this embodiment, a slit coating process is preferably used. The use of a coating process to form a polarizer provides a greater degree of cohesion of the polarizer and reduces the thickness of the device as compared to using an OCA optical adhesive.

In summary, the manufacturing method of a flexible OLED display panel provided by the present disclosure is uses a coating process or a printing process to form each layer structure in a flexible OLED display panel. The manufacturing method effectively reduces the total thickness of the device and increases the adhesion between the layers so as to avoid the problem that the flexible OLED display panel is wrinkled or peeled when bent.

It should be noted that, in this article, relational terms such as first and second and the like are merely used to distinguish one entity or operation from another, not necessarily require or imply any actual relationship or order between such entities or operations. Moreover, the terms "including", "comprising" or any other variation thereof, are intended to cover a non-exclusive inclusion such that a process, method, article, or apparatus that includes a list of elements include not only those elements, but also include other elements not expressly listed or also include elements inherent to the process, method, article, or device. Without further limitations, an element limited by the statement "including a . . . " does not exclude the existence of additional identical elements in the process, method, article, or apparatus that includes the element.

The foregoing descriptions are merely specific implementation manners of the present application. It should be noted that, for those skilled in the art, several improvements and modifications can be made without departing from the principle of the present disclosure, and these improvements and modifications should also be considered as the protection scope of the present application.

What is claimed is:

1. A manufacturing method of a flexible OLED display panel, wherein the flexible OLED display panel comprises a thin film transistor array layer, an OLED display unit, an encapsulation layer and a protection cover sequentially formed on a flexible substrate, and the manufacturing method comprises:
   providing a rigid substrate and forming a flexible substrate on the rigid substrate by using a coating process;
   forming a thin film transistor array layer on the flexible substrate by using an electronic printing process;
   forming an OLED display unit on the thin film transistor array layer by using an electronic printing process;
   forming an encapsulation layer on the OLED display unit by using an electronic printing process;
   forming a protection cover on the encapsulation layer by using a coating process; and
   peeling the rigid substrate from the flexible substrate by using a laser lift-off process;
   wherein the step of forming an OLED display unit by using an electronic printing process specifically comprises:
   printing an anode layer on the thin film transistor by using an electronic printing process;
   printing an organic light emitting layer on the anode layer by using an electronic printing process; and
   printing a cathode layer on the organic light emitting layer by using an electronic printing process.

2. The manufacturing method of a flexible OLED display panel according to claim 1, wherein the step of forming a thin film transistor array layer by using an electronic printing process specifically comprises:
   patterning a gate on the flexible substrate by using an electronic printing process;
   printing a gate insulating layer on the flexible substrate by using an electronic printing process, wherein the gate insulating layer covers the gate;
   patterning a source and a drain on the gate insulating layer by using an electronic printing process;
   printing a patterned active layer between the source and the drain by using an electronic printing process, wherein both ends of the active layer are respectively connected with the source and the drain; and
   printing a flat layer on the gate insulating layer by using an electronic printing process, wherein the flat layer covers the source, the drain and the active layer.

3. The manufacturing method of a flexible OLED display panel according to claim 1, wherein the organic light emitting layer comprises a hole transport functional layer, a light emitting material layer and an electron transport functional layer sequentially formed on the anode layer.

4. The manufacturing method of a flexible OLED display panel according to claim 1, wherein the coating process is a slit coating process or a spin-coating process or a spraying process; and the electronic printing process is an ink-jet printing process or a screen printing process.

5. The manufacturing method of a flexible OLED display panel according to claim 1, wherein material of the flexible substrate is polyimide, polycarbonate, polyethersulfone, polyethylene terephthalate, polyethylene naphthalate, polyarylate or glass fiber reinforced plastic.

6. A manufacturing method of a flexible OLED display panel, wherein the flexible OLED display panel comprises a thin film transistor array layer, an OLED display unit, an encapsulation layer, a touch structure layer and a protection cover sequentially formed on a flexible substrate, and the manufacturing method comprises:

provide a rigid substrate and forming a flexible substrate on the rigid substrate by using a coating process;

forming a thin film transistor array layer on the flexible substrate by using an electronic printing process;

forming an OLED display unit on the thin film transistor array layer by using an electronic printing process;

forming an encapsulation layer on the OLED display unit by using an electronic printing process;

forming a touch structure layer on the encapsulation layer by using an electronic printing process;

forming a protection cover on the touch structure layer by using a coating process; and peeling the rigid substrate from the flexible substrate by using a laser lift-off process.

7. The manufacturing method of a flexible OLED display panel according to claim 6, wherein a nano-silver electronic ink is used as a printing material, and a touch electrode and an electrode lead of the touch structure layer are printed on the encapsulation layer by using an electronic printing process.

8. The manufacturing method of a flexible OLED display panel according to claim 6, wherein the step of forming a thin film transistor array layer by using an electronic printing process specifically comprises:

patterning a gate on the flexible substrate by using an electronic printing process;

printing a gate insulating layer on the flexible substrate by using an electronic printing process, wherein the gate insulating layer covers the gate;

patterning a source and a drain on the gate insulating layer by using an electronic printing process;

printing a patterned active layer between the source and the drain by using an electronic printing process, wherein both ends of the active layer are respectively connected with the source and the drain; and printing a flat layer on the gate insulating layer by using an electronic printing process, wherein the flat layer covers the source, the drain and the active layer.

9. The manufacturing method of a flexible OLED display panel according to claim 6, wherein the step of forming an OLED display unit by using an electronic printing process specifically comprises:

printing an anode layer on the thin film transistor by using an electronic printing process;

printing an organic light emitting layer on the anode layer by using an electronic printing process; and printing a cathode layer on the organic light emitting layer by using an electronic printing process.

10. The manufacturing method of a flexible OLED display panel according to claim 9, wherein the organic light emitting layer comprises a hole transport functional layer, a light emitting material layer and an electron transport functional layer sequentially formed on the anode layer.

11. The manufacturing method of a flexible OLED display panel according to claim 6, wherein the coating process is a slit coating process or a spin-coating process or a spraying process; and the electronic printing process is an ink-jet printing process or a screen printing process.

12. The manufacturing method of a flexible OLED display panel according to claim 6, wherein material of the flexible substrate is polyimide, polycarbonate, polyethersulfone, polyethylene terephthalate, polyethylene naphthalate, polyarylate or glass fiber reinforced plastic.

13. A manufacturing method of a flexible OLED display panel, wherein the flexible OLED display panel comprises a thin film transistor array layer, an OLED display unit, an encapsulation layer, a touch structure layer, a polarizer and a protection cover sequentially formed on a flexible substrate, and the manufacturing method comprises:

providing a rigid substrate and forming a flexible substrate on the rigid substrate by using a coating process;

forming a thin film transistor array layer on the flexible substrate by using an electronic printing process;

forming an OLED display unit on the thin film transistor array layer by using an electronic printing process;

forming an encapsulation layer on the OLED display unit by using an electronic printing process;

forming a touch structure layer on the encapsulation layer by using an electronic printing process;

forming a polarizer on the touch structure layer by using a coating process;

forming a protection cover on the polarizer by using a coating process; and peeling the rigid substrate from the flexible substrate by using a laser lift-off process.

14. The manufacturing method of a flexible OLED display panel according to claim 13, wherein a nano-silver electronic ink is used as a printing material, and a touch electrode and an electrode lead of the touch structure layer are printed on the encapsulation layer by using an electronic printing process.

15. The manufacturing method of a flexible OLED display panel according to claim 13, wherein the step of forming a thin film transistor array layer by using an electronic printing process specifically comprises:

patterning a gate on the flexible substrate by using an electronic printing process;

printing a gate insulating layer on the flexible substrate by using an electronic printing process, wherein the gate insulating layer covers the gate;

patterning a source and a drain on the gate insulating layer by using an electronic printing process;

printing a patterned active layer between the source and the drain by using an electronic printing process, wherein both ends of the active layer are respectively connected with the source and the drain; and printing a flat layer on the gate insulating layer by using an electronic printing process, wherein the flat layer covers the source, the drain and the active layer.

16. The manufacturing method of a flexible OLED display panel according to claim 13, wherein the step of forming an OLED display unit by using an electronic printing process specifically comprises:

printing an anode layer on the thin film transistor by using an electronic printing process;

printing an organic light emitting layer on the anode layer by using an electronic printing process; and printing a cathode layer on the organic light emitting layer by using an electronic printing process.

17. The manufacturing method of a flexible OLED display panel according to claim 16, wherein the organic light emitting layer comprises a hole transport functional layer, a light emitting material layer and an electron transport functional layer sequentially formed on the anode layer.

18. The manufacturing method of a flexible OLED display panel according to claim 13, wherein the coating process is a slit coating process or a spin-coating process or a spraying process; and the electronic printing process is an ink-jet printing process or a screen printing process.

19. The manufacturing method of a flexible OLED display panel according to claim 13, wherein material of the flexible substrate is polyimide, polycarbonate, polyethersulfone, polyethylene terephthalate, polyethylene naphthalate, polyarylate or glass fiber reinforced plastic.

\* \* \* \* \*